(12) United States Patent
Lee et al.

(10) Patent No.: US 7,772,691 B2
(45) Date of Patent: Aug. 10, 2010

(54) THERMALLY ENHANCED WAFER LEVEL PACKAGE

(75) Inventors: Hsin-Hui Lee, Kaohsiung (TW); Mirng-Ji Lii, Sinpu (TW); Chien-Hsiun Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 181 days.

(21) Appl. No.: 11/871,802

(22) Filed: Oct. 12, 2007

(65) Prior Publication Data
US 2009/0096085 A1  Apr. 16, 2009

(51) Int. Cl.
*H01L 23/10* (2006.01)
(52) U.S. Cl. .............. 257/706; 257/720; 257/E23.101
(58) Field of Classification Search .......... 257/706, 257/720, E23.101
See application file for complete search history.

(56) References Cited

U.S. PATENT DOCUMENTS

| 6,605,525 | B2 | 8/2003 | Lu et al. | |
|---|---|---|---|---|
| 6,908,784 | B1* | 6/2005 | Farnworth et al. | 438/106 |
| 6,940,177 | B2 | 9/2005 | Dent et al. | |
| 7,091,062 | B2 | 8/2006 | Geyer | |
| 7,476,980 | B2 | 1/2009 | Rebibis et al. | |
| 2004/0214373 | A1* | 10/2004 | Jiang et al. | 438/110 |
| 2005/0212129 | A1* | 9/2005 | Huang et al. | 257/737 |
| 2007/0298603 | A1* | 12/2007 | Rebibis et al. | 438/613 |

FOREIGN PATENT DOCUMENTS

CN    101101900 A    1/2009

* cited by examiner

*Primary Examiner*—Trung Dang
(74) *Attorney, Agent, or Firm*—Haynes and Boone, LLP

(57) ABSTRACT

A method of forming a package structure includes providing a plurality of dies; attaching the plurality of dies onto a heat-dissipating plate; and sawing the heat-dissipating plate into a plurality of packages, each including one of the plurality of dies and a piece of the heat-dissipating plate.

19 Claims, 12 Drawing Sheets

THERMALLY ENHANCED WAFER LEVEL PACKAGE

TECHNICAL FIELD

This invention relates generally to integrated circuits, and more particularly to the packaging of integrated circuits.

BACKGROUND

With the evolving of semiconductor technologies, semiconductor dies are becoming increasingly smaller and thinner. As a result, the packaging of the semiconductor dies becomes more difficult, adversely affecting the yield.

Package technologies can be divided into two categories. One category of packaging is referred to as chip level packaging, in which dies are sawed from wafers before they are packaged. Advantageously, only "known-good-dies" are packaged. Another advantageous feature of this packaging technology is the possibility of forming fan-out chip packages, which means that the I/O pads on a die can be redistributed to a greater area than the die, and hence the number of I/O pads packed on the surfaces of the dies can be increased.

The other category is typically referred to as wafer level package (WLP), in which dies on a wafer are typically packaged before they are sawed. The WLP technology has some advantages, such as greater throughput and lower cost. Further, less under-fill or molding compound is needed. However, WLP suffers drawbacks. Typically, wafer level packages are formed in a bare-die form as shown in FIG. 1. Solder balls 12 are formed on the top surface of die 10. After being sawed from the respective wafer, die 10 is not protected by any molding compound. Corners 14 of die 10 are thus subject to chipping. A further problem is that since increasingly more circuits and functions are packaged into a single die, the dies needs better heat dissipation ability. Such a requirement is not addressed by existing wafer level packaging processes. Accordingly, new packaging techniques are required.

SUMMARY OF THE INVENTION

In accordance with one aspect of the present invention, a method of forming a package structure includes providing a plurality of dies; attaching the plurality of dies onto a heat-dissipating plate; and sawing the heat-dissipating plate into a plurality of packages, each including one of the plurality of dies and a piece of the heat-dissipating plate.

In accordance with another aspect of the present invention, a method of forming a package structure includes providing a wafer; applying a wafer-size glue layer and a dicing tape onto the wafer, wherein the wafer-size glue layer adjoins both the wafer and the dicing tape; sawing the wafer and the wafer-size glue layer into a first plurality of die units, each comprising a die and a glue layer attached to the die; detaching the dicing tape from the first plurality of die units; attaching a second plurality of die units onto a heat-dissipating plate, wherein the second plurality of die units comprises at least one die unit in the first plurality of die units; filling encapsulation materials into spaces between the die units; mounting solder balls over and electrically connected to bond pads of dies in the second plurality of die units; and sawing the heat-dissipating plate into a plurality of packages, each comprising a die unit and a piece of the heat-dissipating plate.

In accordance with yet another aspect of the present invention, a package structure includes a heat spreader; a die over the heat spreader, wherein the die has a first surface, and a second surface opposite the first surface; a glue layer adjoining the first surface of the die to the heat-dissipating plate; and an encapsulation material over the heat spreader and encircling the die. All edges of the encapsulation material are co-terminus with respective edges of the heat spreader. A bottom surface of the encapsulation material adjoins a top surface of the heat spreader. The package structure further includes a plurality of conductive connectors on the second surface of the die, wherein the conductive connectors are selected from the group consisting essentially of solder balls and conductive bumps.

In accordance with yet another aspect of the present invention, a package structure includes a heat-dissipating plate; a plurality of dies over the heat-dissipating plate; a plurality of glue layers, each adjoining one of the plurality of dies and the heat-dissipating plate; and a plurality of conductive connectors on the plurality of dies.

In accordance with yet another aspect of the present invention, a package structure includes a heat spreader; a die over the heat spreader; a thermally conductive glue layer between and adjoining the die and the heat-dissipating plate; a first encapsulation material over the heat spreader and encircling a lower portion of the die; a plurality of conductive connectors on the top surface of the die; and a second encapsulation material over the first encapsulation material and encircling an upper portion of the die. A top surface of the first encapsulation material is lower than a top surface of the die. A top surface of the second encapsulation material is higher than the top surface of the die and lower than top surfaces of the conductive connectors.

The advantageous features of the present invention include improved thermal dissipating ability of semiconductor dies and reduced likelihood of die chipping.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel package structure and methods of forming the same are provided. The intermediate stages of manufacturing a preferred embodiment of the present invention are illustrated. Throughout the various views and illustrative embodiments of the present invention, like reference numbers are used to designate like elements.

Figure 1:
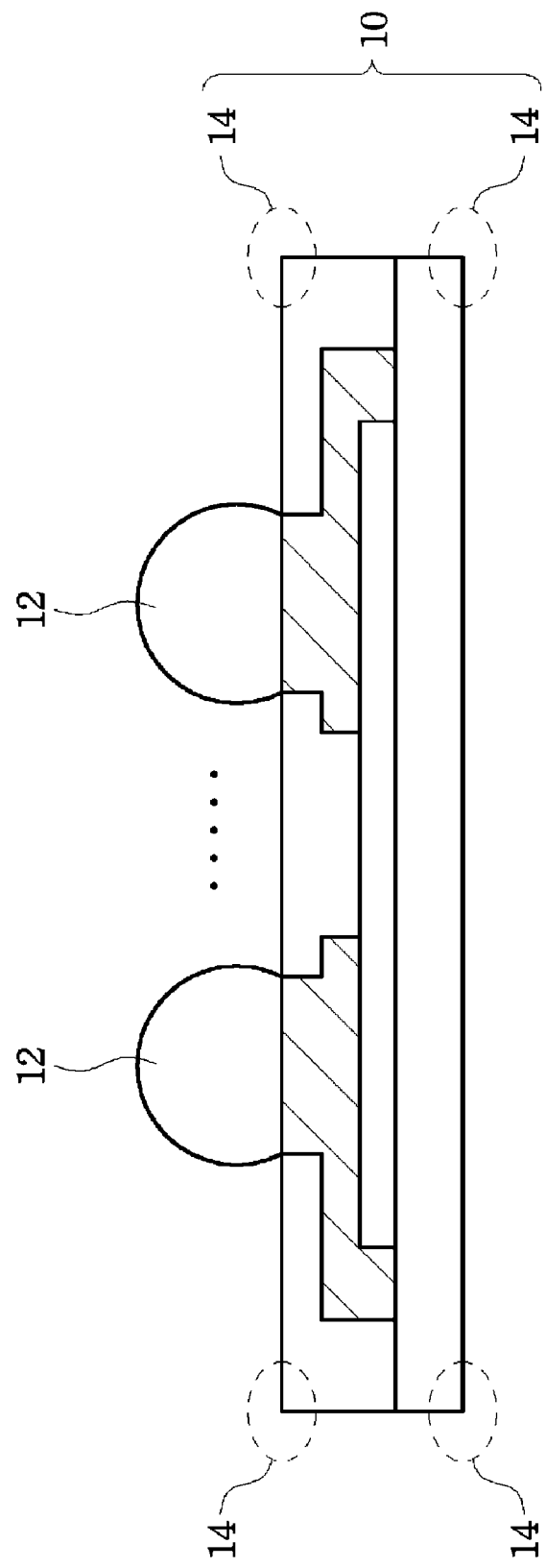
FIG. 1 illustrates a bare die resulted from a wafer level packaging process.
Figure 2:
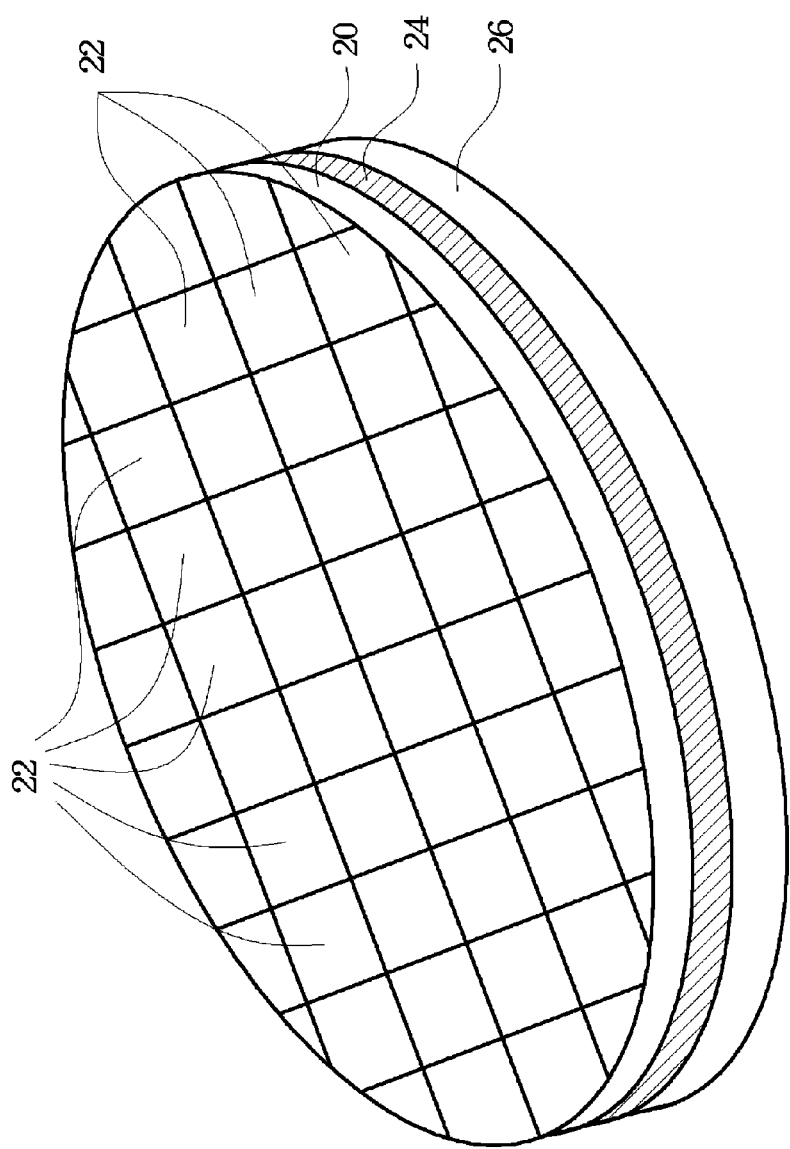
FIGS. 2 through 8B are cross-sectional views of intermediate stages in the manufacturing of an embodiment of the present invention, wherein dies are packaged onto a heat-dissipating plate before they are sawed.

As is commonly known in the art, after the fabrication, semiconductor wafers typically go through wafer-grinding processes to reduce their thicknesses. The dies in the semiconductor wafers are tested. The semiconductor wafers are then diced (sawed), and only known-good-dies are kept for packaging. FIG. 2 illustrates a dicing process of semiconductor wafer 20, which includes a plurality of identical dies 22. Dies 22 may have a thickness of between about 5 mils and about 15 mils. One skilled in the art will realize that the dimensions recited throughout the description are merely examples, and will be scaled down with the down-scaling of integrated circuits. Dies 22 preferably have a rectangular shape, such as squares. Preferably, dies 22 each includes a semiconductor substrate, on which active devices (such as field effect transistors, bipolar transistors, optical devices, and the like), passive devices (such as resistors, inductors, and capacitors), and interconnect structures including metal lines and vias (not shown) are formed.

Figure 3:
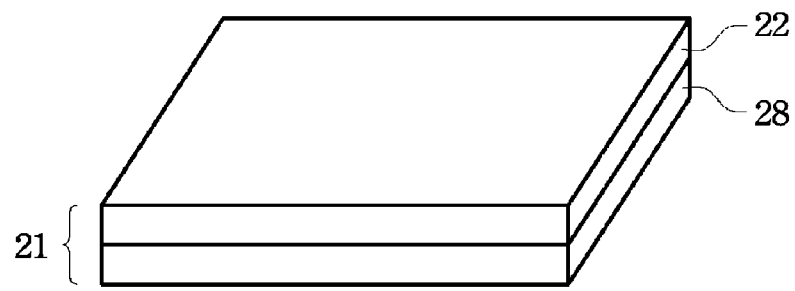

Dicing tape 26, which may be the commonly known blue tape, is attached to the backside of semiconductor wafer 20 through glue layer 24, which has a size equal to, or even greater than wafer 20. Preferably, glue layer 24 has a high thermal conductivity, for example, greater than about 1.57 W/(m*K), which is close to the thermal conductivity of silicon at room temperature. More preferably, the thermal conductivity of glue layer 24 is greater than about 5 W/(m*K). The thickness of glue layer 24 is preferably between about 5 μm and about 35 μm. Thermal fillers may be added into glue layer 24 to further enhance it thermal conductivity. Semiconductor wafer 20 is sawed along scribe lines, and hence dies 22 are separated from each other. Blue tape 26 is then detached from glue layer 24. Since the kerfs extend into glue layer 24, wafer 20 and glue layer 24 are separated into die units 21, each including a piece of glue layer (referred to as glue layer 28) attached to one of the dies 22. FIG. 3 illustrates one of the die units 21.

Figure 4A:
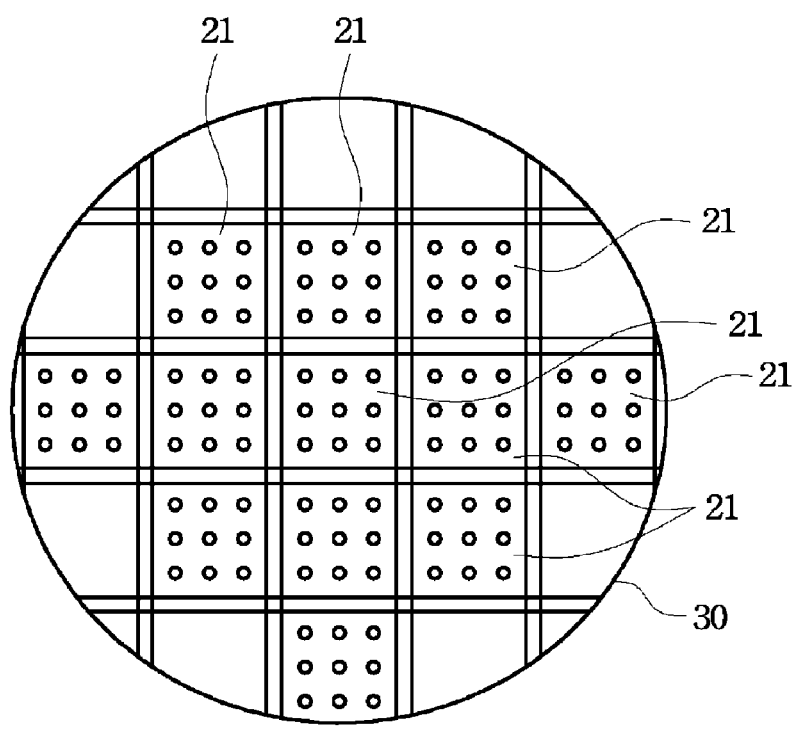

Referring to FIG. 4A, die units 21 are mounted onto heat-dissipating plate 30. In the preferred embodiment, heat-dissipating plate 30 is a metal plate or a metal-containing plate, which may be copper based or aluminum based. The heat spreader has a thickness of between about 10 mils and about 30 mils. Alternatively, heat-dissipating plate 30 is a ceramic plate. In yet other embodiments, heat-dissipating plate 30 is formed of semiconductor materials, dielectric materials, or a combination of two or more of the metals, semiconductor materials, and dielectric materials. Preferably, heat-dissipating plate 30 has a high thermal conductivity, for example, greater than about 1.57 W/(m*K), which is close to the thermal conductivity of silicon, and more preferably greater than about 10 W/(m*K). Even more preferably, the thermal conductivity of heat-dissipating plate 30 is greater than about 100 W/(m*K) so that the heat generated in dies 22 may be effectively dissipated through heat-dissipating plate 30. Heat-dissipating plate 30 may have a circular shape with a diameter substantially equal to common diameters of semiconductor wafers, for example, 8 inches, 12 inches, 16 inches, and so on. Alternatively, heat-dissipating plate 30 has a square shape.

Figure 4B:
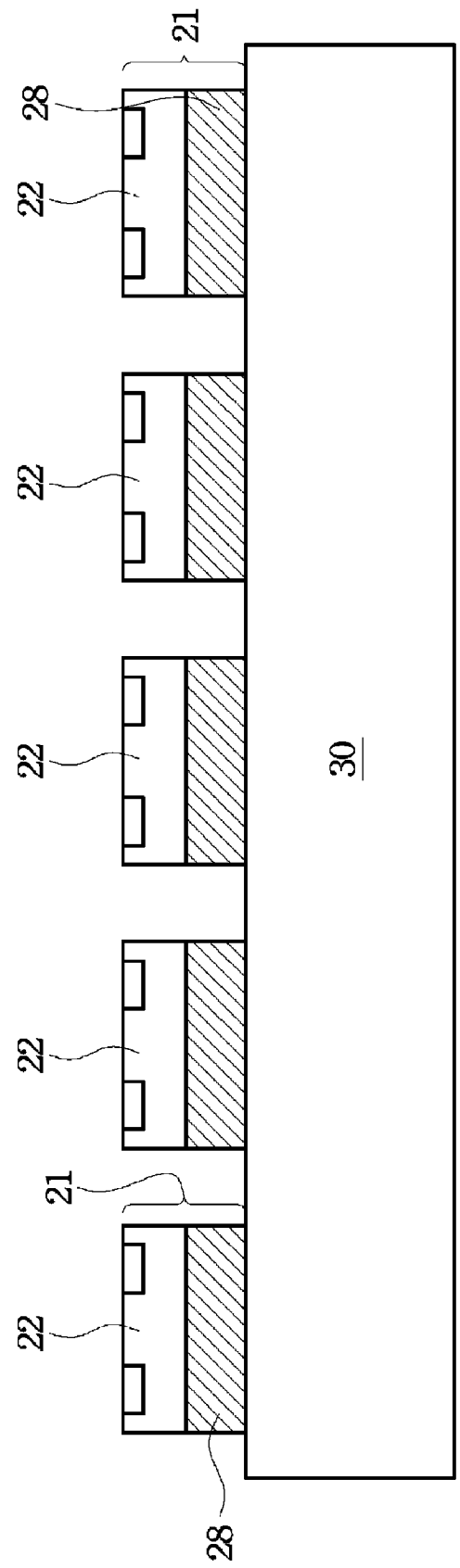

Heat-dissipating plate 30 is pre-marked with the positions of dies 22, so that dies 22 may be accurately mounted on desirable positions on heat-dissipating plate 30. Glue layers 28 are used to join dies 22 and heat-dissipating plate 30. Spaces are left between neighboring die units 22. FIG. 4B illustrates a cross-sectional view of the structure shown in FIG. 4A.

Figure 4C:
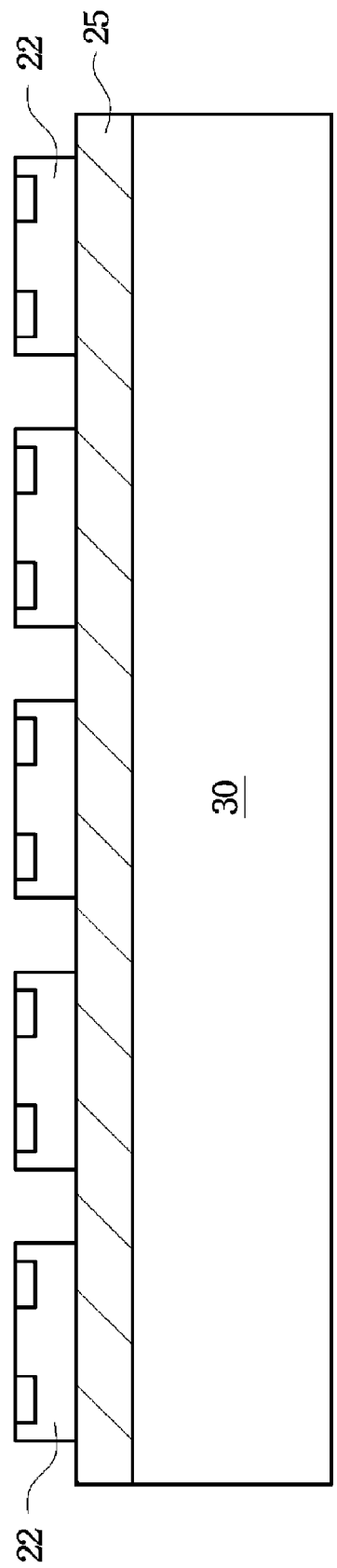

FIG. 4C illustrates an alternative embodiment of the present invention. In this embodiment, dies 22 are separated from the respective glue layers 28 before they are mounted on heat-dissipating plate 30. Accordingly, glue layer 28 is applied on heat-dissipating plate 30, and then dies 22 are attached onto glue layer 25. As discussed in preceding paragraphs, glue layer 25 preferably has a high thermal conductivity.

Figure 5A:
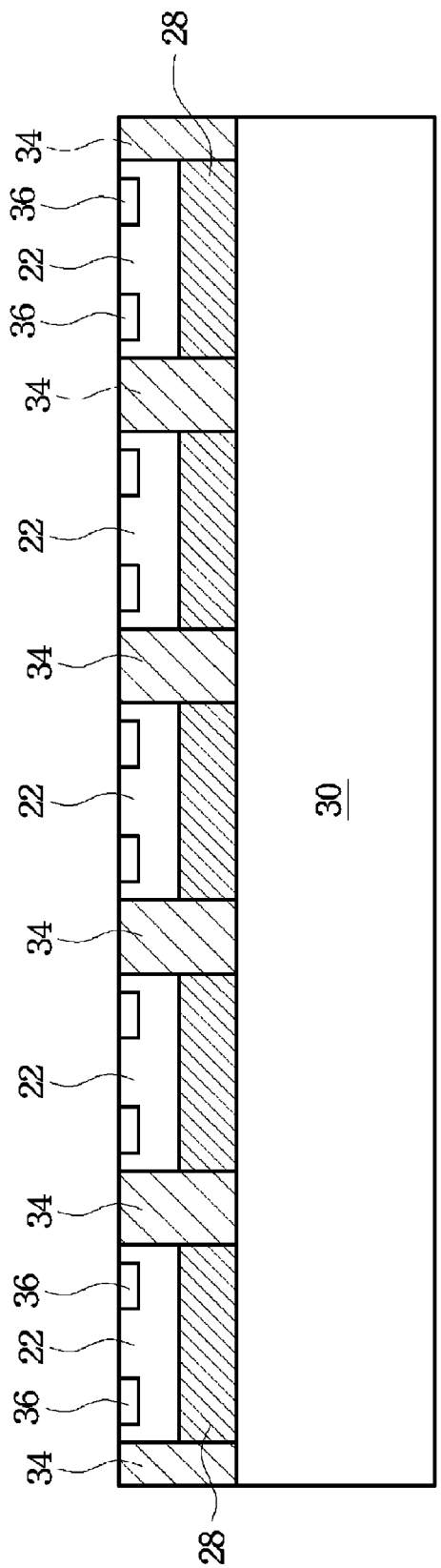
Figure 5B:
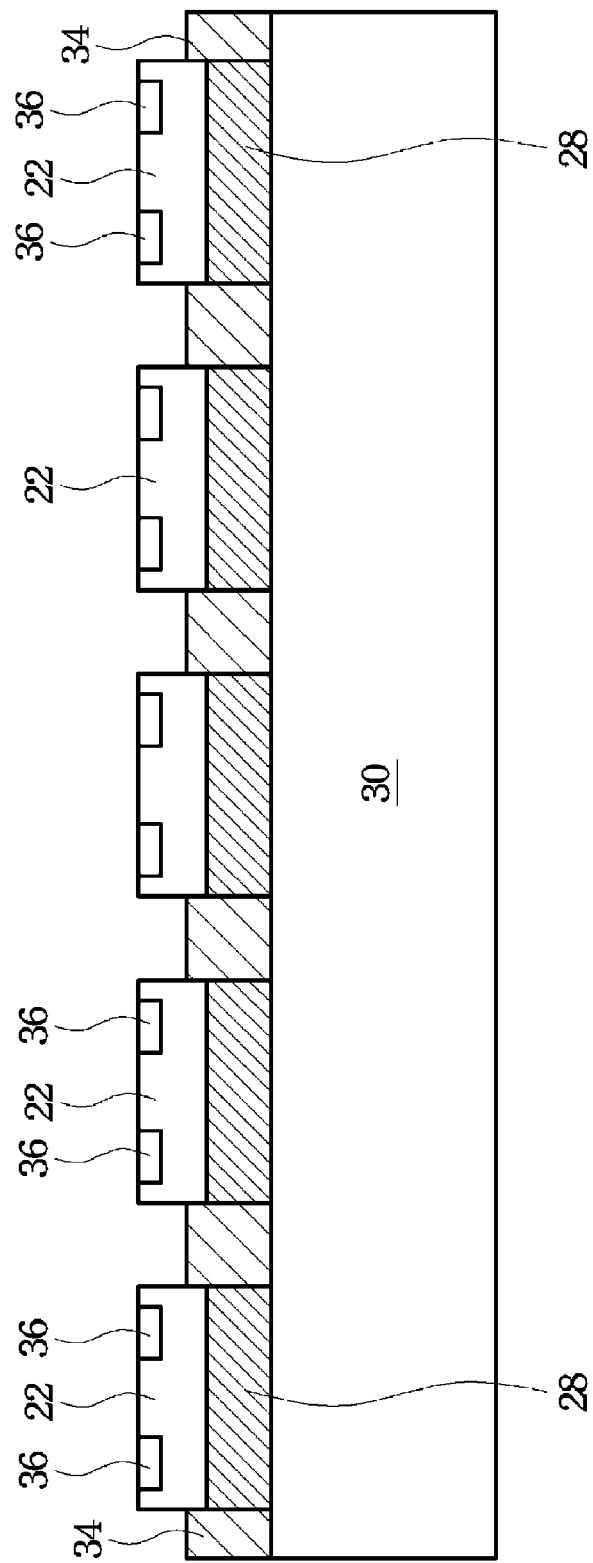

FIGS. 5A and 5B illustrate the filling of encapsulation material 34 into the spaces between dies 22 and glue layers 28. In a first embodiment as shown in FIG. 5A, encapsulation material 34 is filled to substantially level with the top surfaces of dies 22. Care needs to be taken to ensure that bonding pads 36 on the top surface of dies 22 are not covered. In a second embodiment as shown in FIG. 5B, encapsulation material 34 is filled to lower than the top surfaces of dies 22. In an exemplary embodiment, the top surfaces of encapsulation material 34 substantially level with the top surfaces of glue layers 28, or are at a level between the top and the bottom surfaces of dies 22. In the embodiments shown in FIG. 5B, encapsulation material 34 is less likely to cover dies 22. Encapsulation material 34 is preferably an organic material like an epoxy, which is filled into the spaces between dies 22 in a liquid form. A curing process is then performed to solidify encapsulation material 34. The curing may be a thermal curing, for example, at about 175° C. for about 1 hour to about 2 hours.

Figure 6A:
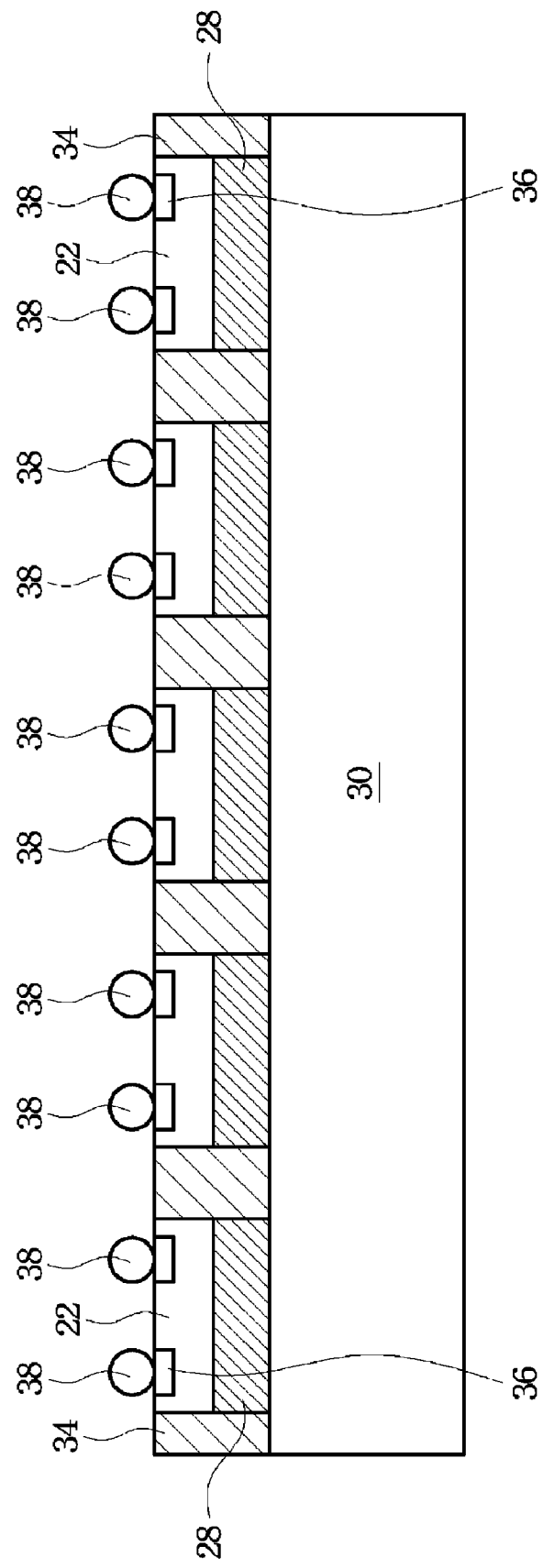

Next, conductive connectors are formed on bond pads 36. FIG. 6A illustrates the mounting of solder balls 38 on bond pads 36, which are located on the top surface of dies 22. In an exemplary embodiment, flux is first applied on bond pads 36, followed by the placement of solder balls 38, each on one of the bond pads 36. Flux can be applied using a plurality of pins, each corresponding to one of bond pads 36. Solder balls 38 may be transferred using a ball-mounting head.

Figure 6B:
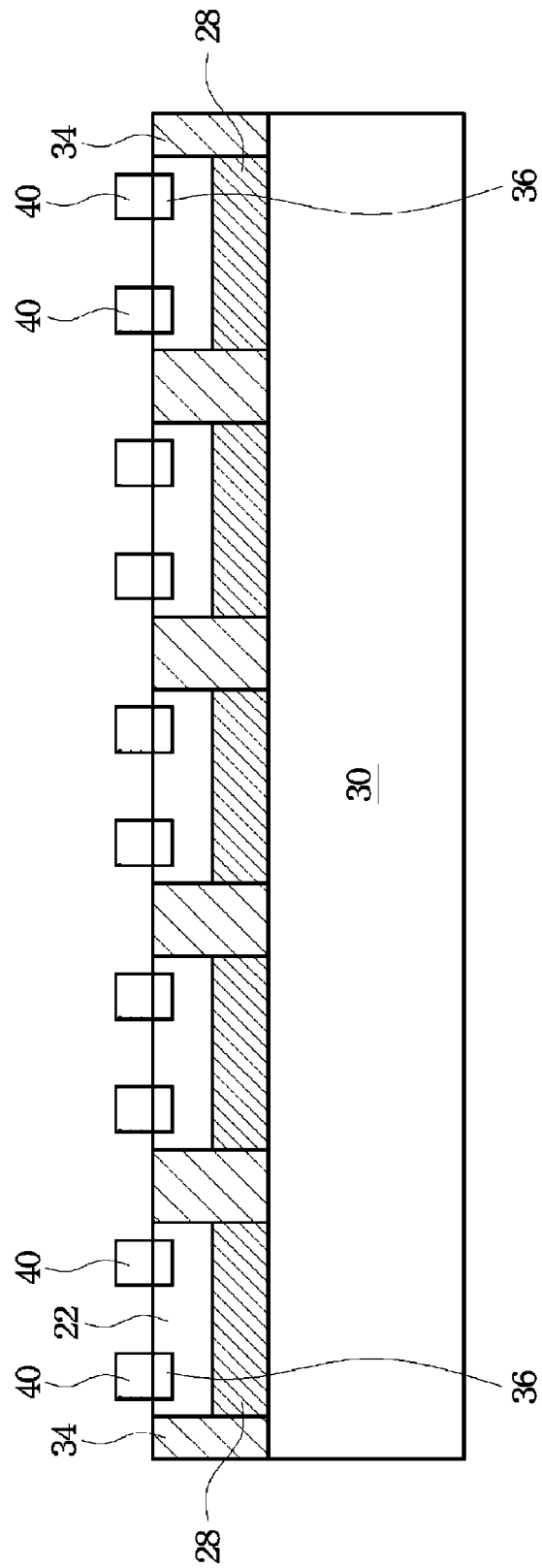

In alternative embodiments, as is shown in FIG. 6B, instead of forming solder balls, conductor pillars such as copper pillars 40 are formed on bond pads 36 before dies 22 are sawed from wafer 20 (refer to FIG. 3). The formation of copper pillars 40 may include forming a disposable layer on top surfaces of wafer 20, wherein the disposable layer may be a dielectric layer or a dry film, and selectively forming openings in the disposable layer, exposing bond pads 36. Copper pillars 40 may then be formed in the openings, for example, by plating. The disposable layer is then removed. Throughout the description, solder balls 38 and/or copper pillars 40 are alternatively referred to as conductive connectors.

Figure 7:
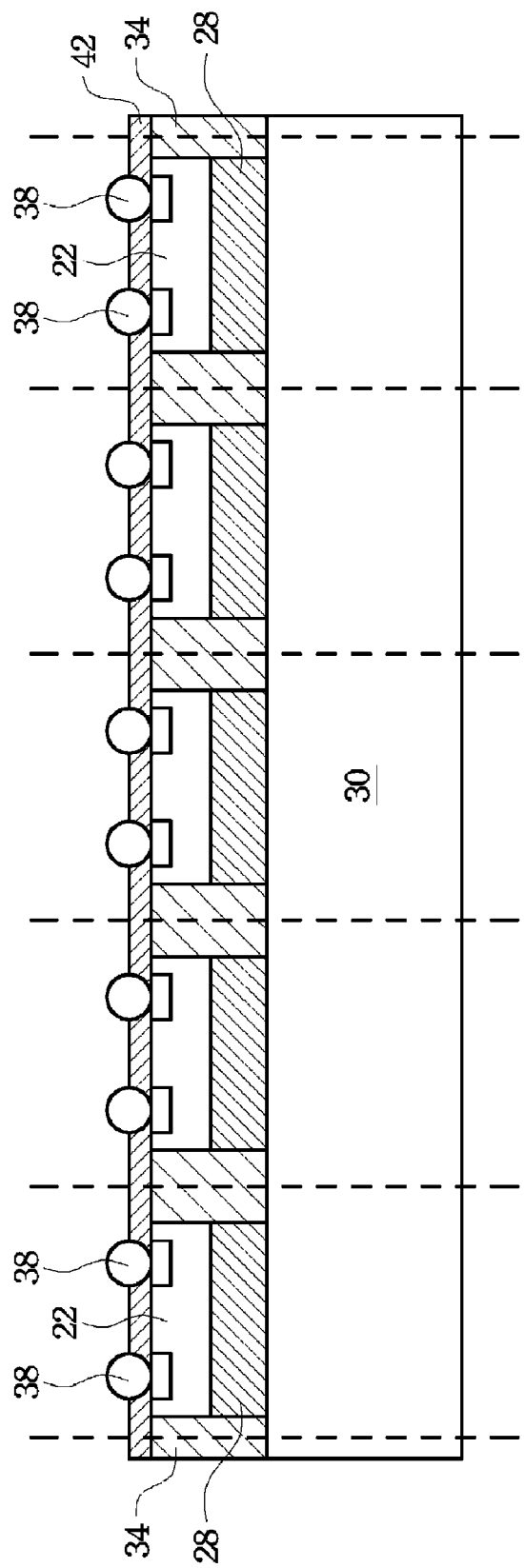

Referring to FIG. 7, additional encapsulation material 42 is applied. Preferably, encapsulation material 42 includes an epoxy or other molding compound materials. In the preferred embodiment, encapsulation material 42 is applied in a liquid form, and is cured using method similar to what is used for curing encapsulation material 34. Encapsulation materials 34 and 42 may include same or different materials.

Figure 8A:
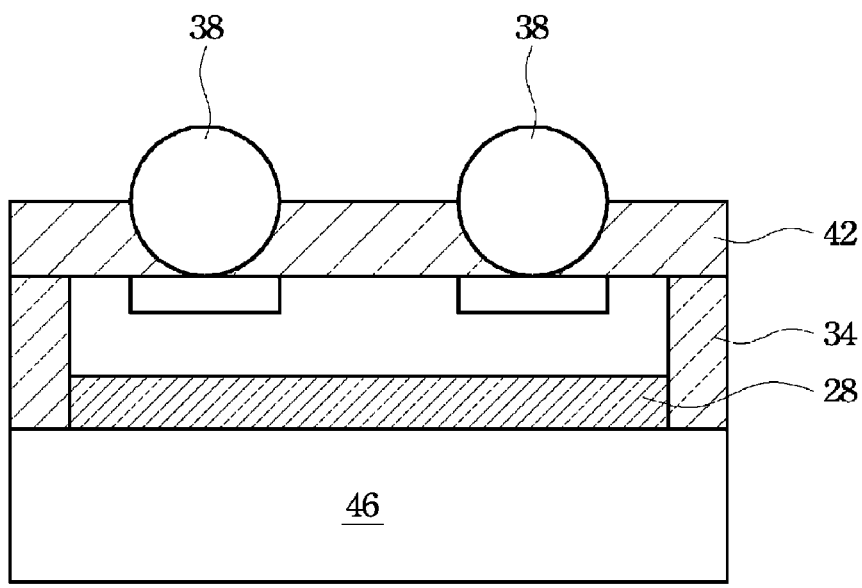

Next, marks (not shown) are made on the top surface of encapsulation material 42, and the structure shown in FIG. 7 is sawed along the dotted lines, separating dies 22 and glue layers 28 into individual packages. Heat-dissipating plate 30 is also sawed and separated into heat spreaders 46. FIG. 8A illustrates a resulting package structure, which includes one of the dies 22 and heat spreader 46. Advantageously, die 22 is thermally coupled to heat spreader 46 through glue layer 28, which has a good thermal conductivity. The heat generated in die 22 can thus be dissipated to heat spreader 46. At this stage, die 22 is encapsulated in encapsulation materials, and thus the corners of dies 22 are protected from chipping.

Figure 8B:
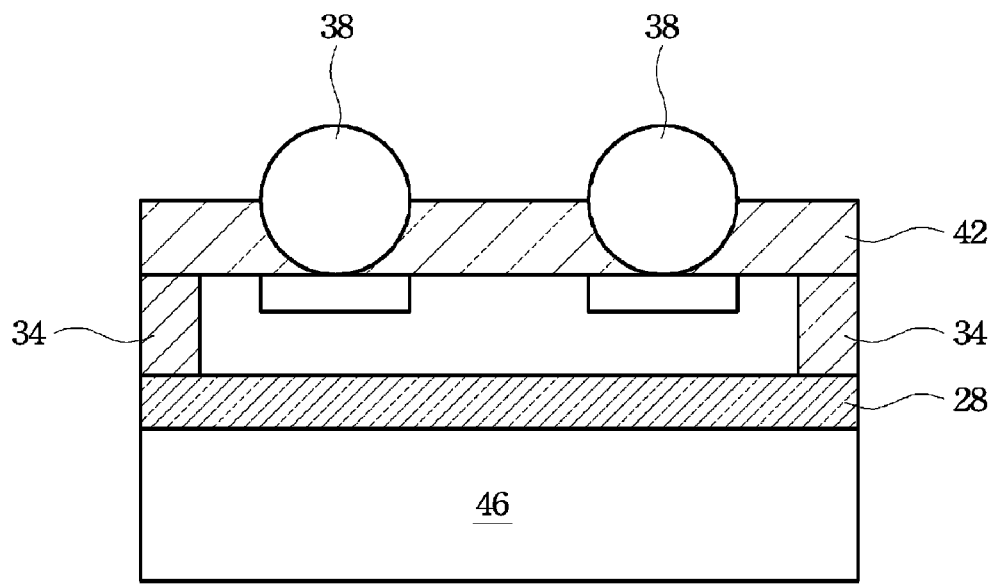

FIG. 8B illustrates a structure as a result of the structure shown in FIG. 4C. Since glue layer 25 is a continuous layer before sawing, the resulting glue layer 28 extends to the edge of the package, and the edges of glue layer 28 are co-terminus with the respective edges of heat spreader 46.

Figure 9:
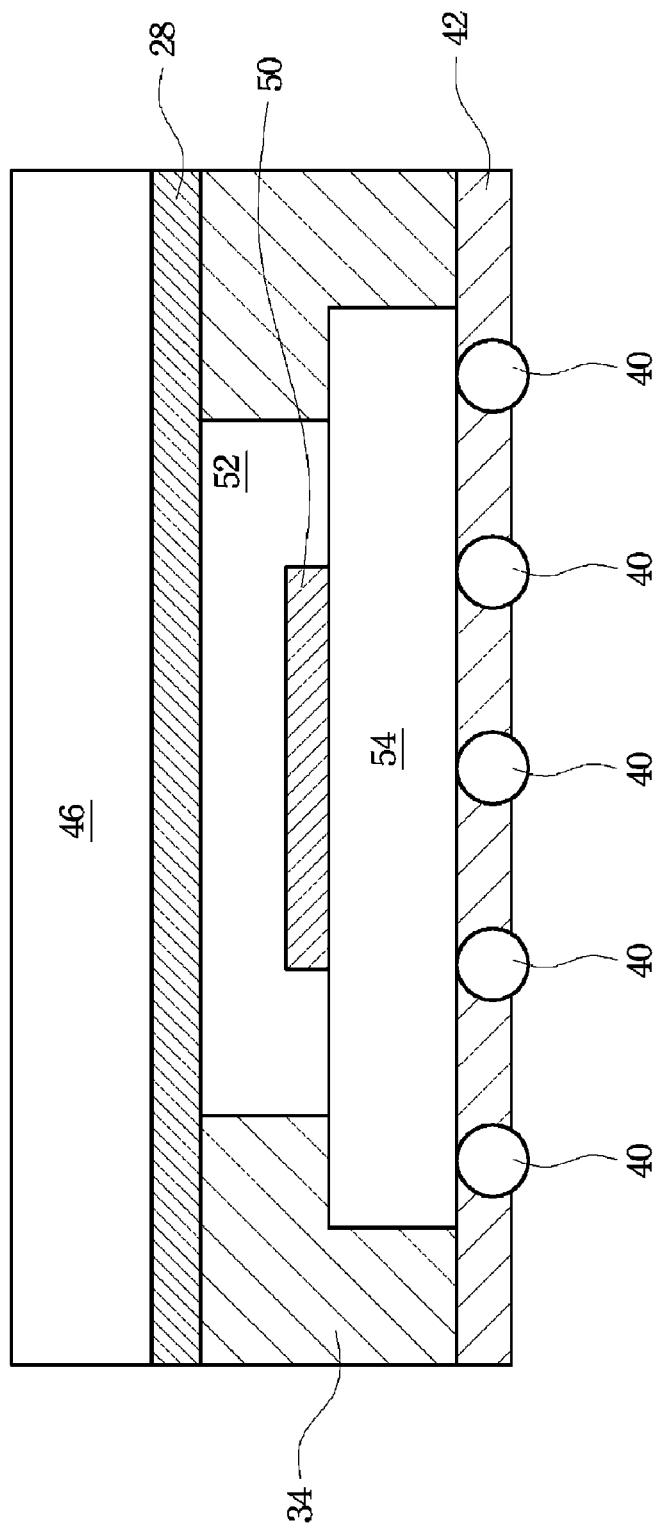
FIG. 9 illustrates an exemplary package structure including a micro-electro-mechanical system (MEMS) device.

The embodiment of the present invention can also be used on micro-electro-mechanical system (MEMS) devices. As is known in the art, MEMS are the integrations of mechanical elements, sensors, actuators, and electronics on a common silicon substrate through micro-fabrication technologies. FIG. 9 illustrates an exemplary structure including die 54 and MEMS device 50, which is protected by protective cover 52. Heat spreader 46 is attached to protective cover 52 through glue layer 28. By treating die 54, MEMS device 50, and protective cover 52 in combination as a single die, the formation of the package structure as shown in FIG. 9 may be formed using essentially the same method and materials as shown in FIGS. 4A through 8.

The embodiments of the present invention have several advantageous features. First, in the packaging process of dies, the dies are protected by encapsulation materials, and thus are free from chipping. Second, the use of heat-dissipating plates not only improves the handling of thin dies, but also provides a low cost thermal enhancement solution. In addition, the heat-disapating plates may have a same size as existing semiconductor wafers, and thus are compatible with the existing wafer testing equipment. The cost of wafer testing can thus be lowered.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A package structure comprising:
   a heat spreader;
   a die over the heat spreader, wherein the die has a first surface, and a second surface opposite the first surface;
   a glue layer adjoining the first surface of the die to the heat spreader;
   an organic encapsulation material over the heat spreader and the second surface of the die and encircling the die, wherein all edges of the encapsulation material are coterminous with respective edges of the heat spreader, wherein a bottom surface of the encapsulation material adjoins a top surface of the heat spreader, and wherein the organic encapsulation material comprises a first layer adjoining the heat spreader, and a second layer over the first layer, wherein the first and the second layers have a different composition; and
   a plurality of conductive connectors on the second surface of the die.

2. The package structure of claim 1, wherein lower portions of the conductive connectors are buried in the organic encapsulation material.

3. The package structure of claim 1, wherein the heat spreader comprises a metal.

4. The package structure of claim 1, wherein the heat spreader has a thickness of between about 10 mils and about 30 mils.

5. The package structure of claim 1, wherein the glue layer has a thickness of between about 5 mils and about 35 mils.

6. The package structure of claim 1, wherein the organic encapsulation material encircles the glue layer.

7. The package structure of claim 1, wherein edges of the glue layer are coterminous with the respective edges of the heat spreader.

8. The package structure of claim 1, wherein the conductive connectors are selected from the group consisting essentially of solder balls and conductive pillars.

9. A package structure comprising:
   a heat-dissipating plate;
   a plurality of dies over the heat-dissipating plate;
   a plurality of glue layers, each adjoining one of the plurality of dies and the heat-dissipating plate, wherein the plurality of dies are spaced apart from each other;
   an organic encapsulation material over and in spaces between the plurality of dies, and in spaces between the plurality of glue layers, wherein the organic encapsulation material comprises a first layer and a second layer, wherein the second layer is over the plurality of dies, and wherein the first layer comprises a different material composition from the second layer; and
   a plurality of conductive connectors on the plurality of dies, wherein a portion of each of the conductive connectors is buried in the encapsulation material.

10. The package structure of claim 9, wherein the plurality of dies are substantially identical.

11. The package structure of claim 9, wherein an additional portion of each of the conductive connectors is exposed above the organic encapsulation material.

12. The package structure of claim 9, wherein the heat-dissipating plate is a metal plate.

13. The package structure of claim 9, wherein the heat-dissipating plate is a ceramic plate.

14. The package structure of claim 9, wherein the heat-dissipating plate has a circular shape.

15. The package structure of claim 9, wherein the heat-dissipating plate has a rectangular shape.

16. A package structure comprising:
   a heat spreader;
   a die over the heat spreader;
   a glue layer between and adjoining the die and the heat spreader;
   a first encapsulation material over the heat spreader and encircling a lower portion of the die, wherein a top surface of the first encapsulation material is lower than a top surface of the die;
   a plurality of conductive connectors on the top surface of the die; and
   a second encapsulation material over the first encapsulation material and encircling an upper portion of the die, wherein a top surface of the second encapsulation material is higher than the top surface of the die and lower than top surfaces of the conductive connectors.

17. The package structure of claim 16, wherein the first and the second encapsulation materials are different materials.

18. The package structure of claim 16, wherein a bottom surface of the first encapsulation material is in physical contact with the heat spreader.

19. The package structure of claim 16, wherein edges of the first and the second encapsulation materials are substantially coterminous with respective edges of the heat spreader.

* * * * *